(12) United States Patent
Li et al.

(10) Patent No.: US 11,095,426 B1
(45) Date of Patent: Aug. 17, 2021

(54) METHOD AND APPARATUS FOR CLOCK RECOVERY

(71) Applicant: Marvell Asia Pte, Ltd., Singapore (SG)

(72) Inventors: Wenjie Li, Shanghai (CN); Jianmin Guo, Sunnyvale, CA (US); Xin Ma, San Jose, CA (US); Hui Wang, Pleasanton, CA (US); Jingjing Deng, Shanghai (CN); Changguo Shen, Nanjing (CN)

(73) Assignee: Marvell Asia Pte, Ltd., Singapore (SG)

( * ) Notice: Subject to any disclaimer, the term of this patent is extended or adjusted under 35 U.S.C. 154(b) by 70 days.

(21) Appl. No.: 16/376,709

(22) Filed: Apr. 5, 2019

Related U.S. Application Data

(60) Provisional application No. 62/653,360, filed on Apr. 5, 2018.

(51) Int. Cl.
*H04L 7/00* (2006.01)
*H03K 3/03* (2006.01)

(52) U.S. Cl.
CPC ......... *H04L 7/0041* (2013.01); *H03K 3/0315* (2013.01)

(58) Field of Classification Search
CPC ............................ H04L 7/0041; H03K 3/0315
USPC ........................................................ 375/354
See application file for complete search history.

(56) References Cited

U.S. PATENT DOCUMENTS

| | | | |
|---|---|---|---|
| 9,432,178 B2* | 8/2016 | Liu | H03L 7/24 |
| 2011/0187469 A1* | 8/2011 | Okada | H03B 5/12 |
| | | | 331/117 FE |
| 2013/0216003 A1* | 8/2013 | Zhuang | H03K 3/0322 |
| | | | 375/316 |

OTHER PUBLICATIONS

Chien, Jun-Chau, et al. A Pulse-Position-Modulation Phase-Noise-Reduction Technique for a 2-to-16GHz Injection-Locked Ring Oscillator in 20nm CMOS, ISSCC 2014, Session 2, Ultra-High-Speed Transceivers and Techniques/2.8, Feb. 10, 2014, p. 1-3.

(Continued)

*Primary Examiner* — Wednel Cadeau

(57) ABSTRACT

Aspects of the disclosure provide a receiver for receiving data over a wired communication channel. The receiver includes an analog front end circuit, a pulse generation circuit and a voltage-controlled oscillator (VCO). The analog front end circuit receives an analog signal carrying data over the wired communication channel, and outputs a data signal with data bit transitions between voltage levels. The pulse generation circuit generates a pulse signal in response to the data bit transitions in the data signal. The voltage-controlled oscillator (VCO) generates an oscillation signal for providing sampling clocks for the data signal. The voltage-controlled oscillator aligns transitions in the oscillation signal to the pulse signal by forcing the oscillation signal to transit voltage levels in response to a pulse in the pulse signal.

20 Claims, 9 Drawing Sheets

(56) References Cited

OTHER PUBLICATIONS

Lee, Jri, Liu, Mingchung. A 20Gb/s Burst-Mode CDR Circuit Using Injection-Locking Technique, ISSCC 2007, Session 2, Optical Communications/2.3, Feb. 12, 2007, p. 1-3.

Sutardja, Sehat. The Future of IC Design Innovation, ISSCC 2015, Session 1, Plenary/1.2, Feb. 23, 2015, p. 1-6.

Masuda, Takashi, et al. A 12Gb/s 0.9mW/Gb/s Wide-Bandwidth Injection-Type CDR in 28nm CMOS with Reference-Free Frequency Capture, ISSCC 2016, Session 10, Advanced Wireline Transceivers and PLLs/10.4, Feb. 2, 2016, p. 1-3.

Maruko, Kenichi, et al. A 1.296-to-5.184Gb/s Transceiver with 2.4mW/(Gb/s) Burst-mode CDR using Dual-Edge Injection-Locked Oscillator, ISSCC 2010, Session 20, Next-Generation Optical & Electrical Interfaces/20.3, Feb. 10, 2010, p. 1-3.

\* cited by examiner

METHOD AND APPARATUS FOR CLOCK RECOVERY

INCORPORATION BY REFERENCE

This present disclosure claims the benefit of U.S. Provisional Application No. 62/653,360, "Data Injection VCOs for High Bandwidth Clock Recovery" filed on Apr. 5, 2018, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In some communication systems, a transmitting circuit transmits a signal that carries data to a receiving circuit. The receiving circuit includes a data and clock recovery circuit to recover a clock signal from the received signal, and then recovers the data from the received signal based on the recovered clock signal.

SUMMARY

Aspects of the disclosure provide a receiver for receiving data over a wired communication channel. The receiver includes an analog front end circuit, a pulse generation circuit and a voltage-controlled oscillator (VCO). The analog front end circuit receives an analog signal carrying data over the wired communication channel, and outputs a data signal with data bit transitions between voltage levels. The pulse generation circuit generates a pulse signal in response to the data bit transitions in the data signal. The voltage-controlled oscillator (VCO) generates an oscillation signal for providing sampling clocks for the data signal. The voltage-controlled oscillator aligns transitions in the oscillation signal to the pulse signal by forcing the oscillation signal to transit voltage levels in response to a pulse in the pulse signal.

In some embodiments, the VCO includes a first differential delay stage configured to generate first differential outputs in response to first differential inputs with a delay that is controlled by a voltage. The VCO further includes a first injection circuit configured to force the first differential outputs to transit voltage levels in response to the pulse in the pulse signal. The VCO also includes one or more second differential delay stages configured to couple together and with the first differential delay stage to form a ring oscillator.

Aspects of the disclosure also provide a method for receiving data over a wired communication channel. The method includes receiving an analog signal that carries data over the wired communication channel, and processing the analog signal to output a data signal with data bit transitions between voltage levels. Further, the method includes generating a pulse signal in response to data bit transitions in the data signal, and aligning transitions in an oscillation signal generated by a voltage-controlled oscillator (VCO) by forcing the oscillation signal to transit voltage levels in response to a pulse in the pulse signal. Then, the method includes generating clock signals for sampling the data signal based on the oscillation signal.

Aspects of the disclosure provide an integrated circuit (IC) chip. The IC chip includes receiving circuitry for receiving data over a wired communication channel. The receiving circuitry includes an analog front end circuit, a pulse generation circuit and a voltage controlled oscillator (VCO). The analog front end circuit receives an analog signal carrying data over the wired communication channel, and outputs a data signal with data bit transitions between voltage levels. The pulse generation circuit generates a pulse signal in response to the data bit transitions in the data signal. The voltage-controlled oscillator generates an oscillation signal for providing sampling clocks for the data signal, and aligns transitions in the oscillation signal to the pulse signal by forcing the oscillation signal to transit voltage levels in response to a pulse in the pulse signal.

In some embodiments, the VCO includes a first differential delay stage configured to generate first differential outputs in response to first differential inputs with a delay that is controlled by a voltage. Further, the VCO includes a first injection circuit configured to force the first differential outputs to transit voltage levels in response to pulses in a pulse signal. The VCO also includes one or more second differential delay stages configured to couple together and with the first differential delay stage to form a ring oscillator.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Aspects of the disclosure provide a receiving circuit for a communication system, such as a communication system with high bandwidth and high data rate requirement. The receiving circuit receives a signal that carries digital values from a transmitting circuit, and recovers clock and data from the received signal. Specifically, the receiving circuit includes a pulse generation circuit configured to generate pulses in response to transitions in the received signal. Further, the receiving circuit includes a voltage-controlled oscillator (VCO) that generates an oscillation signal and phase-aligns (or phase-locks) the oscillation signal to the pulses that are injected into the VCO to generate clock signals. Thus, the clock signals are phase-locked with data in the received signal. The VCO is referred to as injection-locked VCO (IL-VCO). In some embodiments, the clock signals are used to sample the received signal to recover the data. The use of the IL-VCO makes the clock and data recovery to achieve a relatively large bandwidth, such as larger than 100 MHz. According to a simulation that uses a pseudorandom binary sequence (PRBS) data pattern, such as PRBS15 data pattern, the use of IL-VCO reduces noises by 40 dB at 1 MHz and reduces noise by 20 dB at 10 MHz.

The clock and data recovery (CDR) using the IL-VCO can tolerate larger noise level, then other parts of the communication system can be implemented with relaxed noise reduction requirement. For example, the signal noise ratio requirement of the received signal is reduced, and the transmitting circuit can be implemented to transmit the signal with a reduced power in order to reduce power consumption by the transmitting circuit.

In another example, the receiving circuit includes a filter circuit for noise reduction and the filter performance requirement can be relaxed. In an example, the filter circuit is implemented with a relatively small filter capacitor, and the implementation has a relatively small chip area.

In another example, the communication system uses supply regulation to reduce noise from power supply, and the supply regulation requirement is reduced, and supply regulation is simplified.

Figure 1:
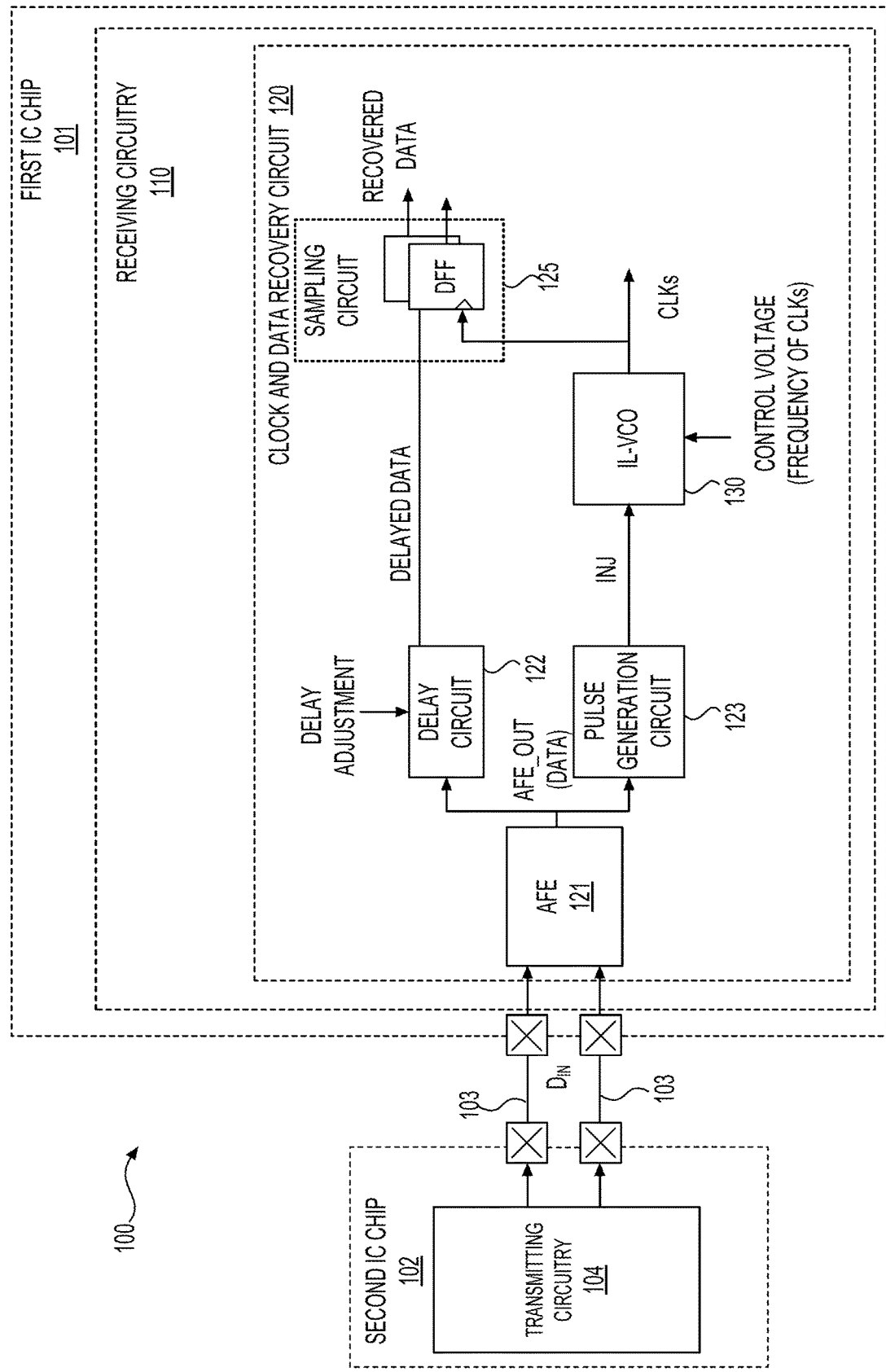
FIG. 1 shows a block diagram of a communication system 100 according to some embodiments of the disclosure.

FIG. 1 shows a block diagram of a communication system 100 according to some embodiments of the disclosure. The communication system 100 includes a first electronic device, such a first IC chip 101 that receives electrical signals from a second electronic device, such as a second IC chip 102. It is noted that IC chips are used as examples in the description, the examples can be modified to use other suitable electronic devices, such as a network switch, a server device, a router, a desktop computer, a laptop computer, a tablet computer, an IC chip package, and the like. The first IC chip 101 includes receiving circuitry 110 (also referred to as a receiver in some examples). The receiving circuitry 110 includes an IL-VCO 130 that is configured to generate a clock signal with a frequency controlled based on a control voltage, and the clock signal is phase-locked to pulses that are generated in response to transitions in a data signal and are injected into the IL-VCO 130.

The communication system 100 is any suitable communication system, such as a wired communication system, a telecommunication system, a local area network (LAN), a wide area network (WAN), Ethernet, a data center, a device-to-device communication system, a circuit-to-circuit communication system, and the like. The first electronic device and the second electronic device are a part of the communication system 100, and the first electronic device receives signals from the second electronic device via a communication channel. In some embodiments, the communication channel is a wired channel that is formed of suitable transmission mediums, such as transmission wires, copper traces on a printed circuit board (PCB), an Ethernet cable, a universal serial bus (USB) cable, peripheral component interconnect express (PCIe) cable, and the like. It is noted that, in some examples, the second electronic device receives signals from the first electronic device via the communication channel in a similar manner.

Specifically, in the FIG. 1 example, the communication system 100 is implemented on a PCB, and the first IC chip 101 and the second IC chip 102 are mounted on the PCB. The PCB includes copper wires 103 that interconnect the first IC chip 101 and the second IC chip 102. In the FIG. 1 example, the second IC chip 102 includes transmitting circuitry 104 (also referred to as a transmitter in some examples) that transmits a data input signal $D_{IN}$, onto the copper wires 103, for example in a form of a pair of differential signals carrying digital data. The first IC chip 110 includes receiving circuitry 110 that receives, from the copper wires, the data input signal $D_{IN}$ and the receiving circuitry 110 recovers clock and data from the received data input signal $D_{IN}$.

In the FIG. 1 example, the receiving circuitry 110 includes a clock and data recovery (CDR) circuit 120 to recover the clock and data from the data input signal $D_{IN}$. The CDR circuit 120 includes an analog front-end (AFE) circuit 121, a delay circuit 122, a pulse generation circuit 123, the IL-VCO 130 and a sampling circuit 125 coupled together as shown in FIG. 1. It is noted that, in some examples, the receiving circuitry 110 is a part of an interface, such as a port of a network device. The interface includes other suitable circuit (not shown), such as a transmitting circuit, and the like.

The analog front-end (AFE) circuit 121 is configured to receive and amplify the received data input signal $D_{IN}$ to a level that is suitable for further processing, such as complementary metal-oxide-semiconductor (CMOS) level that is suitable for processing by CMOS circuitry. In an example of 5V CMOS technology, the acceptable input voltage for a "0" (a low logic state) is from 0 to 0.8V, and the acceptable input voltage for a "1" (a high logic state) is from 2 to 5V. The AFE circuit 121 then amplifies the received data input signal $D_{IN}$ to have low voltages in the range of [0V, 0.8V], and the high voltage in the range of [2V, 5V]. It is noted that the acceptable input voltage ranges in the above example can be modified suitably for most any other CMOS technology.

The AFE circuit 121 outputs an amplified data signal AFE_OUT, and provides the amplified data signal AFE_OUT to the delay circuit 122 and the pulse generation circuit 123.

The pulse generation circuit 123 is configured to generate a pulse signal INJ with pulses in response to transitions in the amplified data signal AFE_OUT. For example, the pulse generation circuit 123 detects rising edges and falling edges in the amplified data signal AFE_OUT, and generates a pulse in the pulse signal INJ in response to each of the rising edges and the falling edges. The pulse generation circuit 123 provides the pulse signal INJ to the IL-VCO 130.

The IL-VCO 130 is configured to generate clock signals CLKs (also referred to as recovered clock signals) based on a control voltage and the pulse signal INJ. In some embodiments, the control voltage is generated based on the frequency of the clock signals CLKs, and is provided to the IL-VCO 130 via a frequency loop (not shown) to control the free running frequency of clock signals CLKs. It is noted that the control voltage can be provided to the IL-VCO 130 via any suitable interface, such as analog voltage interface for voltage control, digital interface for voltage control, and the like. In an example, the control voltage controls a supply voltage to transistors in the IL-VCO 130 to control the free-running frequency of the IL-VCO 130. Further, the IL-VCO 130 phase-locks the clock signal CLKs to the pulses in the pulse signal INJ. Detail examples of the IL-VCO 130 will be discussed with reference to FIG. 2-FIG. 8.

The delay circuit 122 is configured to suitably delay the amplified data signal AFE_OUT to generate a delayed data signal DATA for sampling. In some examples, the delay circuit 122 is configured to match the delay of the pulse generation circuit 123 and the IL-VCO circuit 130. In an example, the delay adjustment for the delay circuit 122 is generated based on a timing difference between the delayed data signal DATA and a clock signal CLK, and is fed back to the delay circuit 122 to suitably adjust the delay for generating the delayed data signal DATA in order to sample the delayed data signal DATA at an optimum time (based on the clock signal CLK).

The sampling circuit 125 is configured to sample the delayed data signal DATA based on edges of the clock signals CLKs. In an example, the sampling circuit 125 includes a plurality of D-flip flops. The D-flip flops are configured to catch, buffer and output samples of the delayed data signal DATA based on the clock signals CLKs. It is noted that other suitable sampling circuit can be used to replace the D-flip flops.

Figure 2:
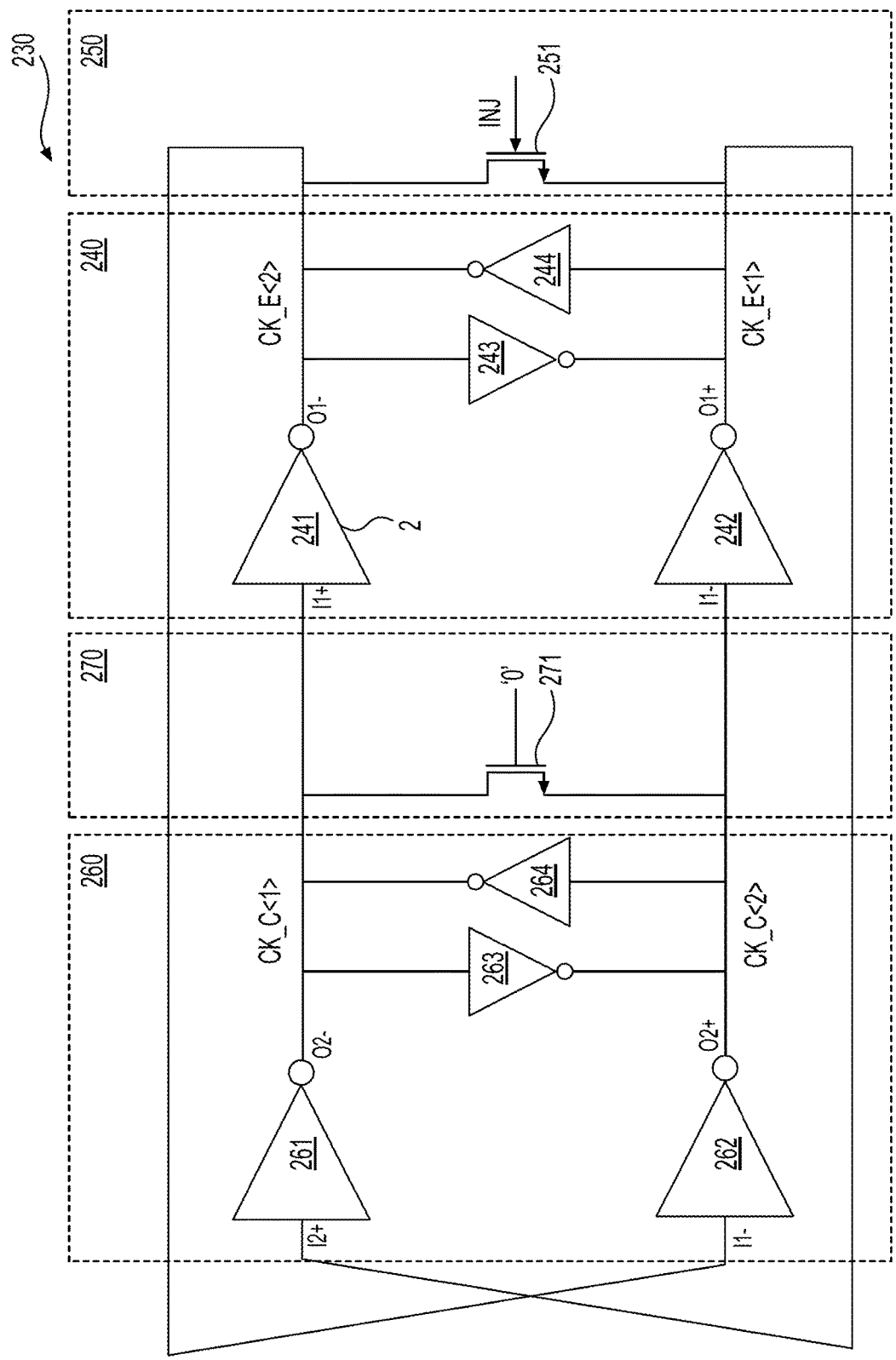
FIG. 2 shows a circuit diagram of an injection-locked voltage-controlled oscillator (IL-VCO) 230 for use in the communication system 100 according to an embodiment of the disclosure.

FIG. 2 shows a circuit diagram of an IL-VCO 230 for use in the communication system 100 suitably as IL-VCO 130, according to an embodiment of the disclosure. The IL-VCO 230 includes a plurality of differential delay stages, including a first differential delay stage 240 and a second differential delay stage 260, that are coupled into a ring to form a ring oscillator to generate oscillation signals. The IL-VCO 230 also includes an injection circuit 250 that injects pulses into the ring oscillator to force the oscillation signals to phase-align with the injected pulses. Further, the IL-VCO 230 includes an injection circuit 270 that matches the injection circuit 250.

In the FIG. 2 example, the first differential delay stage 240 and the second differential delay stage 260 have the same circuit structure and are cross-coupled to form a ring oscillator. Specifically, the first differential delay stage 240 includes four inverters 241-244 coupled together as shown in FIG. 2. The inverters 241 and 242 respectively invert differential inputs I1+ and I1− and drives differential outputs O1− and O1+ with a delay to the differential inputs I1+ and I1−. The inverters 243 and 244 form a latch to memorize and maintain the differential outputs O1− and O1+. The second differential delay stage 260 includes four inverters 261-264 coupled together as shown in FIG. 2. The inverters 261 and 262 respectively invert differential inputs I2+ and I2− and drive differential outputs O2− and O2+ with a delay to the differential inputs I2+ and I2−. The inverters 263 and 264 form a latch that remembers electronic states (low or high) of the differential outputs O2− and O2+, and maintains the electronic states of the differential outputs O2− and O2+. The inverters 241, 242, 261 and 262 are referred to as driving inverters in an example. The inverters 243, 244, 263 and 264 are referred to as latch inverters in an example.

The differential outputs O2− and O2+ are respectively coupled with the differential inputs I1+ and I1−, and the differential outputs O1− and O1+ are respectively cross-coupled with the differential inputs I2+ and the I2−.

In some embodiments, the supply voltage to the inverters 241-244 and 261-264 is controlled based on a control voltage. Thus, the inverter delays for the inverters 241-244 and 261-264 are functions of the control voltage, and thus the free running frequency of the ring oscillator is a function of the control voltage.

The injection circuit 250 is coupled between the differential output O1− and O1+ to inject a pulse signal INJ with pulses at the differential output O1− and O1+ to force the differential output O1− and o1+ to phase-lock (or phase align) with the injected pulses. Specifically, in the FIG. 2 example, the injection circuit 250 includes a N-type metal-oxide-semiconductor (MOS) transistor 251 with source and drain terminals connected to the differential outputs O1− and O1+, and the gate terminal of the N-type MOS transistor 251 is controlled by the pulse signal INJ.

The injection circuit 270 is a dummy (or replica) injection circuit that matches with the injection circuit 250. The injection circuit 270 is coupled between the differential output O2− and O2+, and has the same circuit structure as the injection circuit 250. Specifically, in the FIG. 2 example, the injection circuit 270 includes an N-type MOS transistor 271 with source and drain terminals connected to the differential outputs O2− and O2+. The gate terminal of the N-type MOS transistor 271 is controlled by a low voltage (corresponding to binary logic 0), thus the N-type MOS transistor 271 is turned off during operation (without pulse injection). In an example, the N-type MOS transistor 271 has matching characteristics (same sizes, same channel orientation, same pattern shape, and the like) to the N-type MOS transistor 251. Thus, the second differential delay stage 260 has matching loads (matching parasitic capacitances) as the first differential stage delay 240.

The IL-VCO 230 outputs a clock signal CK_E<1> from the output O1+, outputs a clock signal CK_E<2> from the output O1−, outputs a clock signal CK_C<1> from the output O2−, and outputs a clock signal CK_C<2> from the output O2+. The clock signals CK_E<1> and CK_E<2> are referred to as edge clock signals, and the clock signals CK_C<1> and CK_C<2> are referred to as center clock signals. According to an aspect of the disclosure, inverters 241, 242, 261 and 262 are of the same sizes, and then the clock signals CK_E<1>, CK_C<1>, CK_E<2> and CK_C<2> form the clock signals of quadrature phases (e.g, 0°, 90°, 180° and 270°).

The operation of the IL-VCO 230 will be discussed with reference to FIG. 3.

Figure 3:
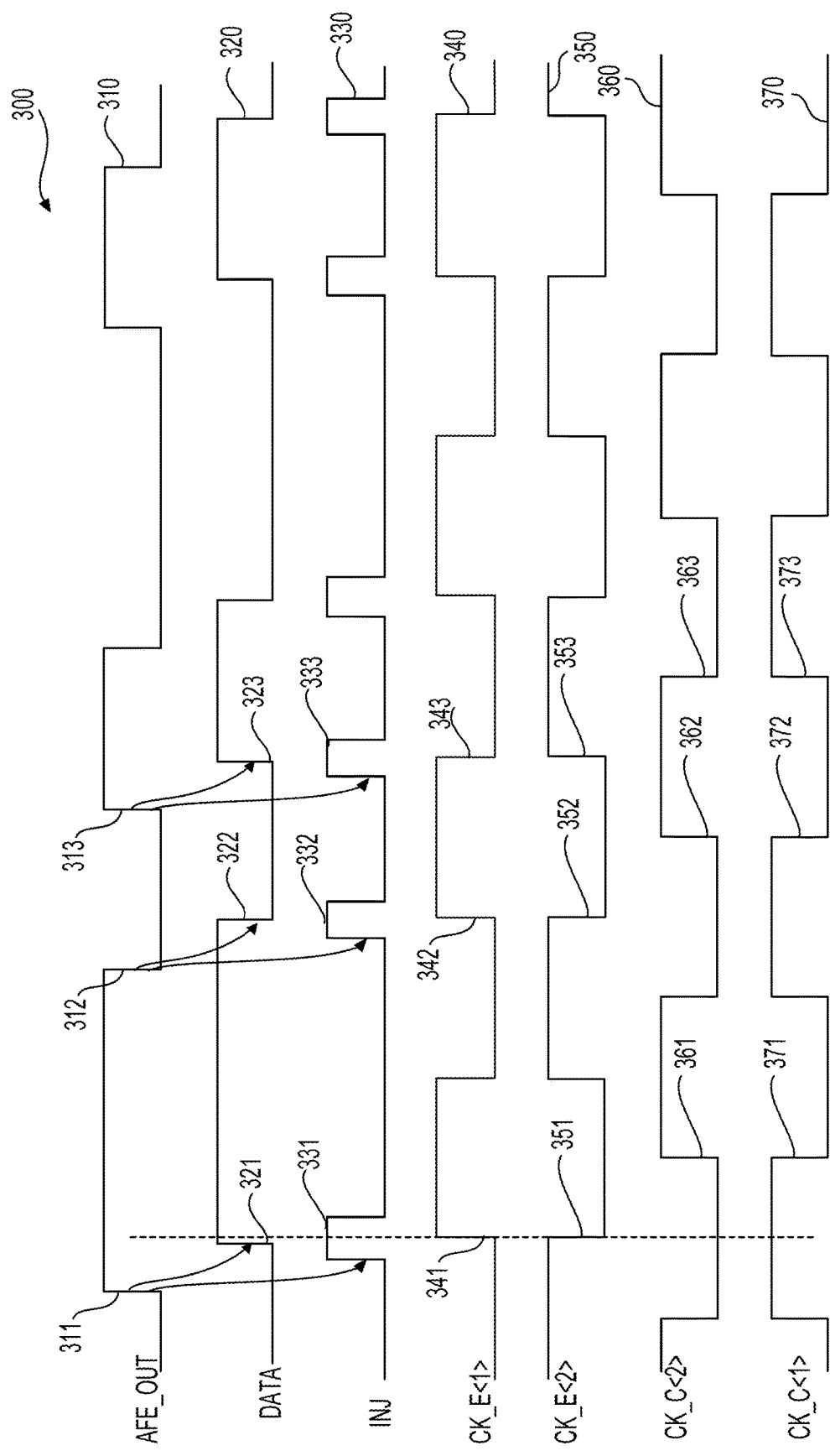
FIG. 3 shows a plot 300 of waveforms for the IL-VCO 230 according to an embodiment of the disclosure.

FIG. 3 shows a plot 300 of waveforms with regard to the receiving circuitry 110 and the IL-VCO 230 according to an embodiment of the disclosure. The plot 300 includes a waveform 310 for the amplified data signal AFE_OUT, a waveform 320 for the delayed data signal DATA, a waveform 330 for the pulse signal INJ, a waveform 340 for the clock signal CK_E<1>, a waveform 350 for the clock signal CK_E<2>, a waveform 360 for the clock signal CK_C<2>, and a waveform 370 for the clock signal CK_C<1>.

During operation, for example, in response to a transition 311 in the amplified data signal AFE_OUT, the delayed data signal DATA has a transition 321 that is delayed from the transition 311 by the delay circuit 122. Further, in response to the transition 311, a pulse 331 is generated in the pulse signal INJ. The pulse 331 causes the N-type MOS transistor 251 to turn on. In some examples, the size of the N-type MOS transistor 251 is suitably designed such that the N-type MOS transistor 251 has enough injection strength to force the clock signals CK_E<1> and CK_E<2> to transit, thus the turn-on of N-type MOS transistor 251 causes the clock signal CK_E<1> to transit from low voltage to high voltage as shown by 341, and causes the clock signal CK_E<2> to transit from high voltage to low voltage as shown by 351. Thus, edges 341 and 351 (rising edge and/or falling edge) of the clock signals CK_E<1> and the CK_E<2> are generated in response to (e.g., a short time after) a rising edge of the pulse 331, and are forced to phase-align (or phase lock) with the pulse 331.

The transition 341 then causes the clock signal CK_C<1> to transit from high voltage to low voltage (with a delay of the inverter 261) as shown by 371, and the transition 351 then causes the clock signal CK_C<2> to transit from low voltage to high voltage (with a delay of the inverter 262) as shown by 361.

Similarly, in response to a transition 312 in the amplified data signal AFE_OUT, the delayed data signal DATA has a transition 322 that is delayed from the transition 312 by the delay circuit 122. Further, in response to the transition 312, a pulse 332 is generated in the pulse signal INJ. The pulse 332 causes the N-type MOS transistor 251 to turn on. In some examples, the turn-on of the N-type MOS transistor 251 causes the clock signal CK_E<1> to transit from low voltage to high voltage as shown by 342, and causes the clock signal CK_E<2> to transit from high voltage to low voltage as shown by 352. Thus, edges 342 and 352 (rising edge and/or falling edge) of the clock signals CK_E<1> and the CK_E<2> are forced to phase-align (or phase-lock) with the pulse 332.

The transition 342 then causes the clock signal CK_C<1> to transit from high to low (with a delay of the inverter 261) as shown by 372, and the transition 352 then causes the clock signal CK_C<2> to transit from low voltage to high voltage (with a delay of the inverter 262) as shown by 362.

Further, in the FIG. 3 example, in response to a transition 313 in the amplified data signal AFE_OUT, the delayed data signal DATA has a transition 323 that is delayed from the transition 312 by the delay circuit 122. Further, in response to the transition 313, a pulse 333 is generated in the pulse signal INJ. The pulse 333 causes the N-type MOS transistor 251 to turn on. In some examples, the turn-on of the N-type MOS transistor 251 causes the clock signal CK_E<1> to transit from high voltage to low voltage as shown by 343, and causes the clock signal CK_E<2> to transit from low voltage to high voltage as shown by 353. Thus, edges 343 and 353 (rising edge and/or falling edge) of the clock signals CK_E<1> and the CK_E<2> are forced to phase-align (or phase-lock) with the pulse 333.

The transition 343 then causes the clock signal CK_C<1> to transit from low voltage to high voltage (with a delay of the inverter 261) as shown by 373, and the transition 353 then causes the clock signal CK_C<2> to transit from high voltage to low voltage (with a delay of the inverter 262) as shown by 363.

In some examples, the delay time of the delay circuit 122 is about the same as the delay time of the pulse generation circuit 123 and the IL-VCO 130, thus the edges of the clock signals CK_E<1> and CK_E<2> are aligned substantially with the edges (e.g., data bit transition edges) of the delayed data signal DATA, and the edges of the clock signals CK_C<1> and CK_C<2> are aligned substantially with centers of data bits of the delayed data signal DATA.

The clock signals CK_E<1>, CK_C<1>, CK_E<2> and CK_C<2> have a frequency that is half of the data bit rate of the delayed data signal DATA. It is noted that, in the FIG. 3 example, the frequency of the clock signals CK_E<1>, CK_C<1>, CK_E<2> and CK_C<2> is a function of the inverter delay of the inverters 241, 242, 261 and 262.

According to an aspect of the disclosure, the communication system 100 has a noise level that depends on system implementation. In an example, the communication system 100 has a noise level that is a function of wire length of the wires 103. When the communication system 100 is implemented with relatively long wires 103, the communication system 100 has a relatively high noise level, and when the communication system 100 is implemented with relatively short wires 103, the communication system 100 has relatively small noise level.

In some embodiment, the IL-VCO 130 is implemented with adjustable injection strength (also referred to as injection gain). Then, when the communication system 100 has a relatively high noise level, the IL-VCO is controlled to have a relatively large injection strength and when the communication system 100 has relatively small noise level, the IL-VCO 130 is controlled to have a relatively small injection strength.

Figure 4:
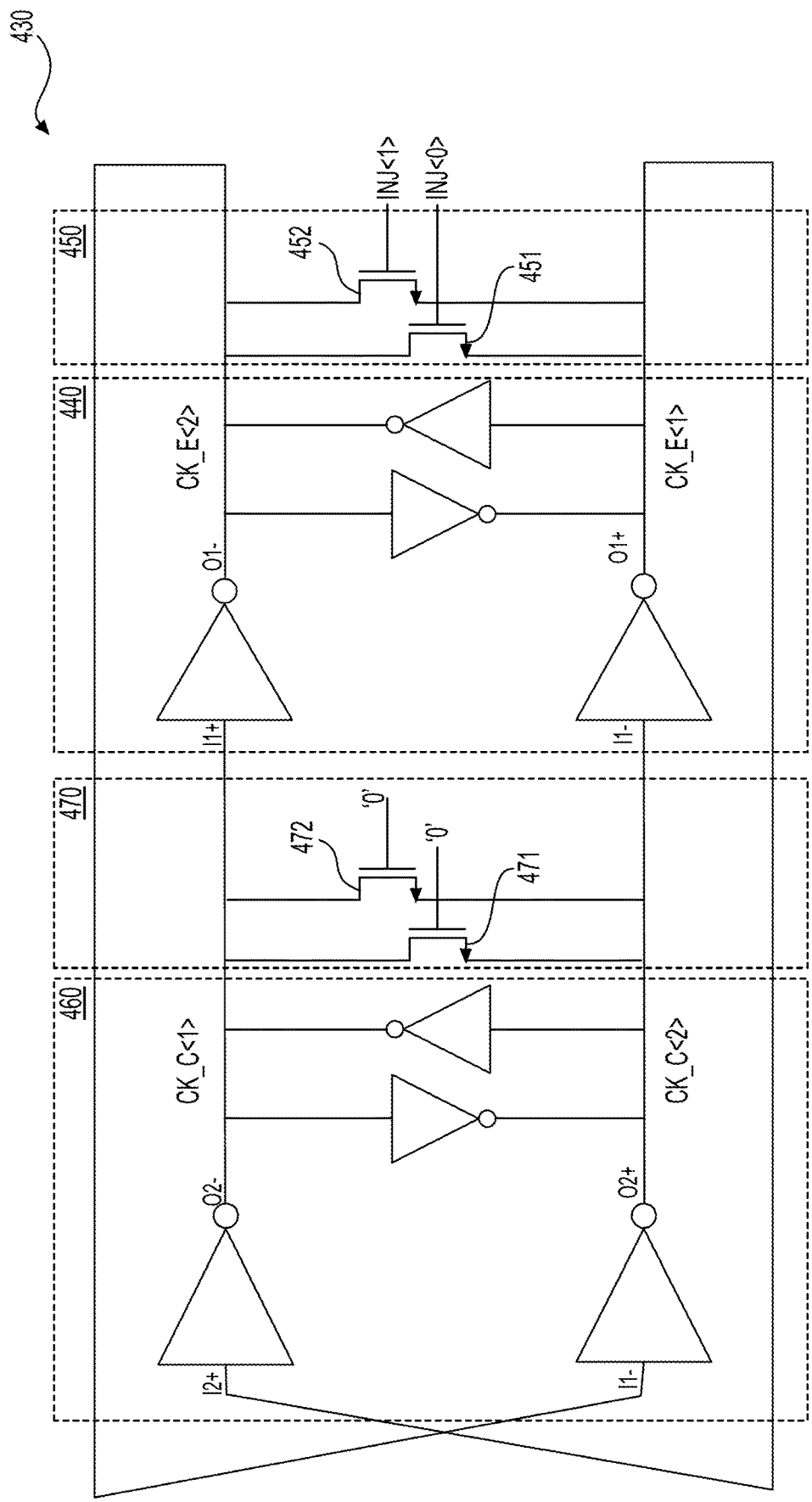
FIG. 4 shows a circuit diagram of an IL-VCO 430 for use in the communication system 100 according to an embodiment of the disclosure.

FIG. 4 shows a circuit diagram of an IL-VCO 430 for use in the communication system 100 in the place of the IL-VCO 130 according to an embodiment of the disclosure. The IL-VCO 430 has adjustable injection strength.

The IL-VCO 430 includes a first differential delay stage 440 and a second differential delay stage 460 that are coupled into a ring to form a ring oscillator to generate oscillation signals. The IL-VCO 430 includes injection circuit 450 that inject pulses into the ring oscillator to force the oscillation signals to phase-align with the injected pulses. The injection circuit 450 is configured to have adjustable injection strength. The IL-VCO 430 also includes an injection circuit 470 that is a dummy (or replica) injection circuit corresponding to the injection circuit 450.

The first differential delay stage 440 and the second differential delay stage 460 are similarly configured as the first differential delay stage 240 and the second differential delay stage 260 in the IL-VCO 230 and utilize components that are identical or equivalent to those used in the IL-VCO 230; the description of these components has been provided above and will be omitted here for clarity purposes.

The injection circuit 450 includes two N-type MOS transistors 451 and 452 that are coupled in parallel between the differential output O1− and O1+. The two N-type MOS transistors 451 and 452 are respectively controlled by pulse signals INJ<0> and INJ<1> (also referred to as a two-bit pulse signal) to inject pulses at the differential output O1− and O1+ to force the differential output O1− and o1+ to phase-lock (or phase align) with the injected pulses.

The pulse signals INJ<0> and INJ<1> are generated to collectively determine the injection strength of the IL-VCO 430. In an example, the width/length ratio of the N-type MOS transistor 452 is twice of the width/length ratio of the N-type MOS transistor 451. In an example, when the communication system 100 is implemented with a relatively low noise level (e.g., shorter wires 103), the pulse signal INJ<0> is generated to be the same as the pulse signal INJ in FIG. 2, and the pulse signal INJ<1> is generated to have constant low voltage level (corresponding to logic "0"). Thus, the N-type MOS transistor 452 is turned off to reduce power consumption during pulse injection. The N-type MOS transistor 451 is turned on/off to inject pulses in the IL-VCO 430.

In another example, when the communication system 100 is implemented with a relatively high noise level (e.g., longer wires 103), the pulse signal INJ<1> is generated to be the same as the pulse signal INJ in FIG. 2, and the pulse signal INJ<0> is generated to have constant low voltage level (corresponding to logic "0"). Thus, the N-type MOS transistor 451 is turned off to reduce power consumption during pulse injection. The N-type MOS transistor 452 is turned on/off to inject pulses in the IL-VCO 430. The N-type MOS transistor 452 has a relatively large width/length ratio than the N-type MOS transistor 451 and thus has a larger injection strength to suppress the relatively high noise.

It is noted that when the communication system 100 has even higher noise level, both of the pulse signals INJ<0> and INJ<1> can be generated to be the same as the pulse signal INJ to provide higher injection strength.

The injection circuit 470 is a dummy (or replica) injection circuit. The injection circuit 470 is coupled between the differential output O2− and O2+. Specifically, in the FIG. 4 example, the injection circuit 470 includes N-type MOS transistors 471 and 472 with source and drain terminals connected to the differential outputs O2− and O2+. The gate terminals of the N-type MOS transistors 471 and 472 are controlled by a low voltage (corresponding to binary logic 0), thus the N-type MOS transistors 471 and 472 are turned off during operation (without pulse injection). In an example, the N-type MOS transistors 471 and 472 respectively have matching characteristics (same sizes, same directions, same shapes, and the like) to the N-type MOS transistors 451 and 452. Thus, the second differential stage 460 has matching loads (matching parasitic capacitances) as the first differential stage 440.

In some examples, the first IC chip 101 receives an input signal that is indicative of the noise level in the communication system 100, and the pulse signals INJ<0> and INJ<1> are generated based on the input signal. In some examples, the first IC chip 101 includes a programmable memory component that is programmed to store a value that is indicative of the noise level in the communication system 100, and the pulse signals INJ<0> and INJ<1> are generated based on the stored value.

Figure 5:
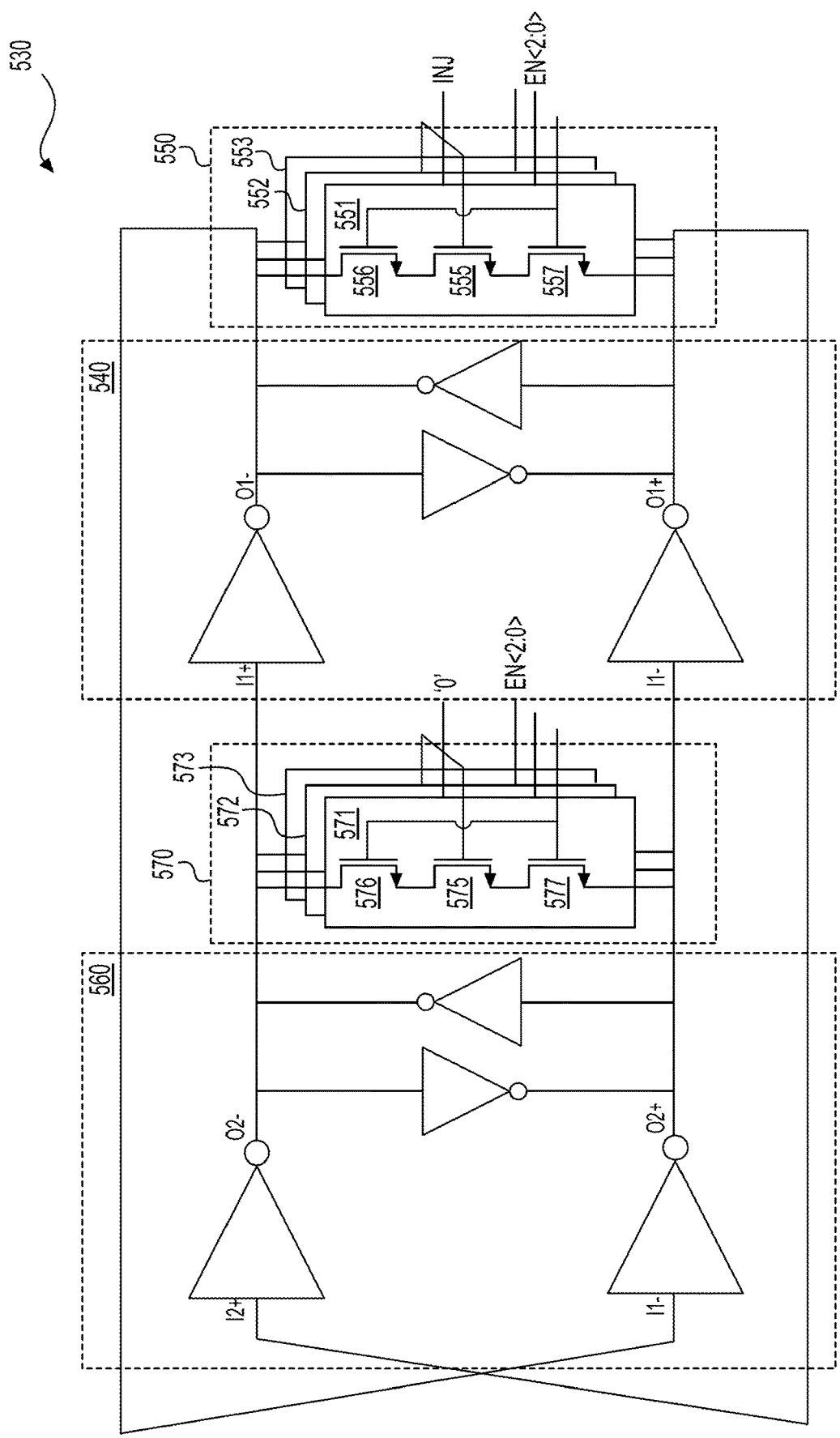
FIG. 5 shows a circuit diagram of an IL-VCO 530 for use in the communication system 100 according to an embodiment of the disclosure.

FIG. 5 shows a circuit diagram of an IL-VCO 530 for use in the communication system 100 in the place of the IL-VCO 130 according to an embodiment of the disclosure. The IL-VCO 530 has adjustable injection strength.

The IL-VCO 530 includes a first differential delay stage 540 and a second differential delay stage 560 that are coupled into a ring to form a ring oscillator to generate oscillation signals, and includes injection circuits 550 and 570 that inject pulses into the ring oscillator to force the oscillation signals to phase-align with the injected pulses. The injection circuit 550 is configured to have adjustable injection strength, and the injection circuit 570 is a dummy (or replica) injection circuit corresponding to the injection circuit 550.

The first differential delay stage 540 and the second differential delay stage 560 are similarly configured as the first differential delay stage 240 and the second differential delay stage 260 in the IL-VCO 230 and utilize components that are identical or equivalent to those used in the IL-VCO 230; the description of these components has been provided above and will be omitted here for clarity purposes.

The injection circuit 550 includes a plurality of injection paths 551-553 that are coupled in parallel between the differential output O1− and O1+. The plurality of injection paths 551-553 are respectively controlled by enable signals EN<0> to EN<2> to inject pulses at the differential output O1− and O1+ to force the differential output O1− and O1+ to phase-lock (or phase align) with the injected pulses.

While, three injection paths 551-553 are shown in FIG. 3, it is noted that the injection circuit 550 can include any suitable number (e.g., equal or larger than two) of injection paths. The injection paths 551-553 are similarly configured. Using the injection path 551 as an example, the injection path 551 includes N-type MOS transistors 555-557 that are coupled in series between the differential output O1− and O1+. In the FIG. 5 example, the gate terminal of the N-type MOS transistor 555 is controlled by the pulse signal INJ, and the gate terminals of the N-type MOS transistors 556 and 557 are control by the enable signal EN<0>. When the enable signal EN<0> has low voltage (logic "0"), the N-type MOS transistors 556 and 557 are turned off to isolate the N-type MOS transistor 555 from the differential output O1− and O1+, thus pulses in the pulse signal INJ cannot be injected into the IL-VCO via the injection path 551. When the enable signal EN<0> has high voltage (logic "1"), the N-type MOS transistors 556 and 557 are turned on to connect the N-type MOS transistor 555 to the differential output O1− and O1+, thus pulses in the pulse signal INJ can be injected into the IL-VCO via the injection path 551.

In the FIG. 3 example, each of the injection paths 551-553 is independently controllable, thus the injection circuit 550 is able to provide a greater number of adjustable injection strength levels.

It is noted that, in some examples, the injection paths 551-553 are each configured to have same injection strength, and the injection strength of the injection circuit 550 is determined by a number of injection paths that are enabled.

In other examples, the injection paths 551-553 are configured to have different injection strength. In an example, the injection path 551 is configured to have the least injection strength (e.g., smallest width/length ratio for the transistor 555), the injection path 553 is configured to have the most injection strength, and the injection path 552 is configured to have a medium injection strength. The enable signals EN<0>-EN<2> are generated based on the noise level of the communication system 100.

In an example, when the communication system 100 is implemented with a relatively low noise level (e.g., shorter wires 103), the enable signal EN<0> is set to be logic "1" to enable the injection path 551, and the enable signals EN<1> and EN<2> are cleared to be logic "0" to disable the injection paths 552 and 553 in order to reduce power consumption during pulse injection.

In another example, when the communication system 100 is implemented with a relatively high noise level (e.g., longer wires 103), the enable signal EN<1> is set to be logic "1" to enable the injection path 552 for larger injection strength. It is noted that the enable signals EN<0> and EN<2> can be cleared to be logic "0" to disable the injection paths 551 and 553, or can be set to logic "1" to further increase injection strength.

The injection circuit 570 is a dummy (or replica) injection circuit corresponding to the injection circuit 550. The injection circuit 570 has matching structures and components to the injection circuit 550. However, in the injection circuit 570, the injection signal INJ is replaced with logic "0". The injection circuit 570 provides matching loads as the injection circuit 550, but does not perform pulse injection.

In some examples, the first IC chip 101 receives an input signal that is indicative of the noise level in the communication system 100, and the enable signals EN<0>-EN<2> are generated based on the input signal. In some examples, the first IC chip 101 includes a programmable memory component that is programmed to store a value that is indicative of the noise level in the communication system 100, and the enable signals EN<0>-EN<2> are generated based on the stored value.

The IL-VCO examples in FIG. 2, FIG. 4 and FIG. 5 are implemented using two-stage ring oscillators to generate quadrature-phase clock signals for half data rate clock and data recovery. In some embodiments, a four-stage ring oscillator is used to implement an IL-VCO. The IL-VCO that is based on the four-stage ring oscillator improves oscillation startup performance, and improves figure-of-merit (FOM) (a quantity used to characterize the performance of an oscillator). Further, the IL-VCO based on the four-stage ring oscillator can provide clock signals for higher data rate. For example, a two-stage based IL-VCO of a frequency f can provide clocks for processing a data rate of 2×f and a four-stage based IL-VCO of a frequency f can provide clocks for processing a data rate of 4×f Because of the quad rate operation, the four-stage based IL-VCO has two injection nodes in some examples.

Figure 6:
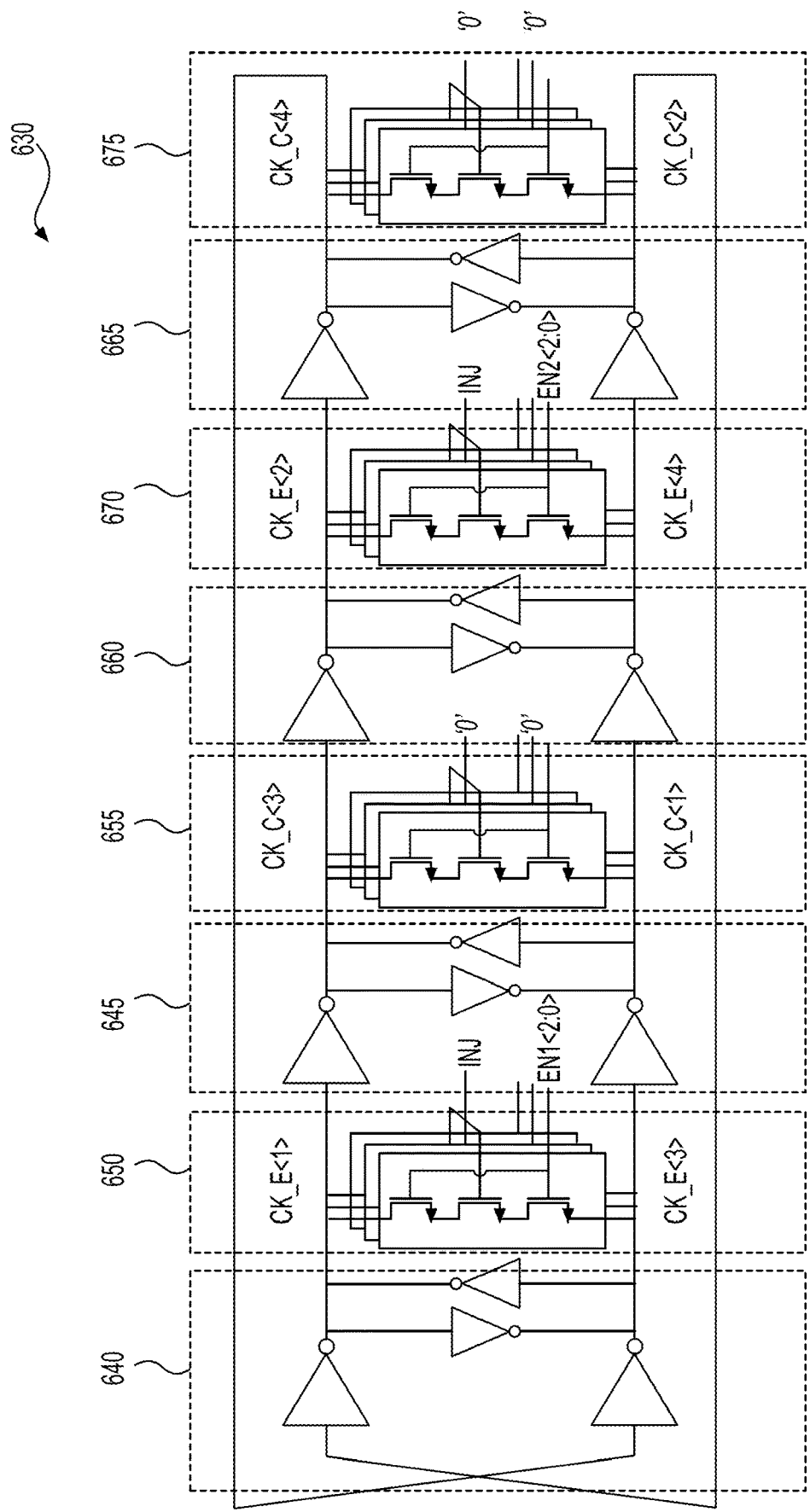
FIG. 6 shows a circuit diagram of an IL-VCO 630 for use in the communication system 100 according to an embodiment of the disclosure.

FIG. 6 shows a circuit diagram of an IL-VCO 630 for use in the communication system 100 in the place of the IL-VCO 130 according to an embodiment of the disclosure. The IL-VCO 630 is based on a four-stage ring oscillator and has two injection nodes.

The IL-VCO 630 includes a first differential delay stage 640, a second differential delay stage 645, a third differential delay stage 660 and a fourth differential delay stage 665 that are coupled into a ring to form a ring oscillator to generate oscillation signals, and includes injection circuits 650, 655, 670 and 675 that inject pulses into the ring oscillator to force the oscillation signals to phase-align with the injected pulses. The injection circuits 650 and 670 are configured to inject the pulses in the pulse signal INJ, and the injection circuit 655 and 675 are dummy (or replica) injection circuits corresponding to the injection circuits 650 and 670.

The first differential delay stage 640, the second differential delay stage 645, the third differential delay stage 660 and the fourth differential delay stage 665 are similarly configured as the first differential delay stage 240 and the second differential delay stage 260 in the IL-VCO 230 and utilize components that are identical or equivalent to those used in the IL-VCO 230; the description of these components has been provided above and will be omitted here for clarity purposes.

The injection circuits 650, 655, 670 and 675 are similarly configured as the injection circuits 550 and 570 in the IL-VCO 530 and utilize components that are identical or equivalent to those used in the IL-VCO 530; the description of these components has been provided above and will be omitted here for clarity purposes.

In the FIG. 6 example, pulses in the pulse signal INJ are selectively injected via one of the injection circuit 650 and the injection circuit 670. For example, pulses corresponding to odd data bit positions (or even data bit positions) are injected via the injection circuit 650, and the pulses corresponding to even data bit positions (or odd data bit positions) are injected via the injection circuit 670. In some embodiments, two selection signals SE1 and SE2 are generated to select the injection circuit 650 or the injection circuit 670. Similarly to the example in FIG. 5, enable signals EN<0>-EN<2> are generated to control the injection strength. The selection signals SE1 and SE2 are combined (e.g., logic AND) with the enable signals EN<0>-EN<2> to generate the enable signals EN1<0>-EN1<2> (also referred as EN1<2:0>, and enable signals EN2<0>-EN2<2> (also referred to as EN2<2:0>). The enable signals EN1<0>-EN1<2> are used to respectively control the injection paths in the injection circuit 650. The enable signals EN2<0>-EN2<2> are used to respectively control the injection paths in the injection circuit 670.

Figure 7:
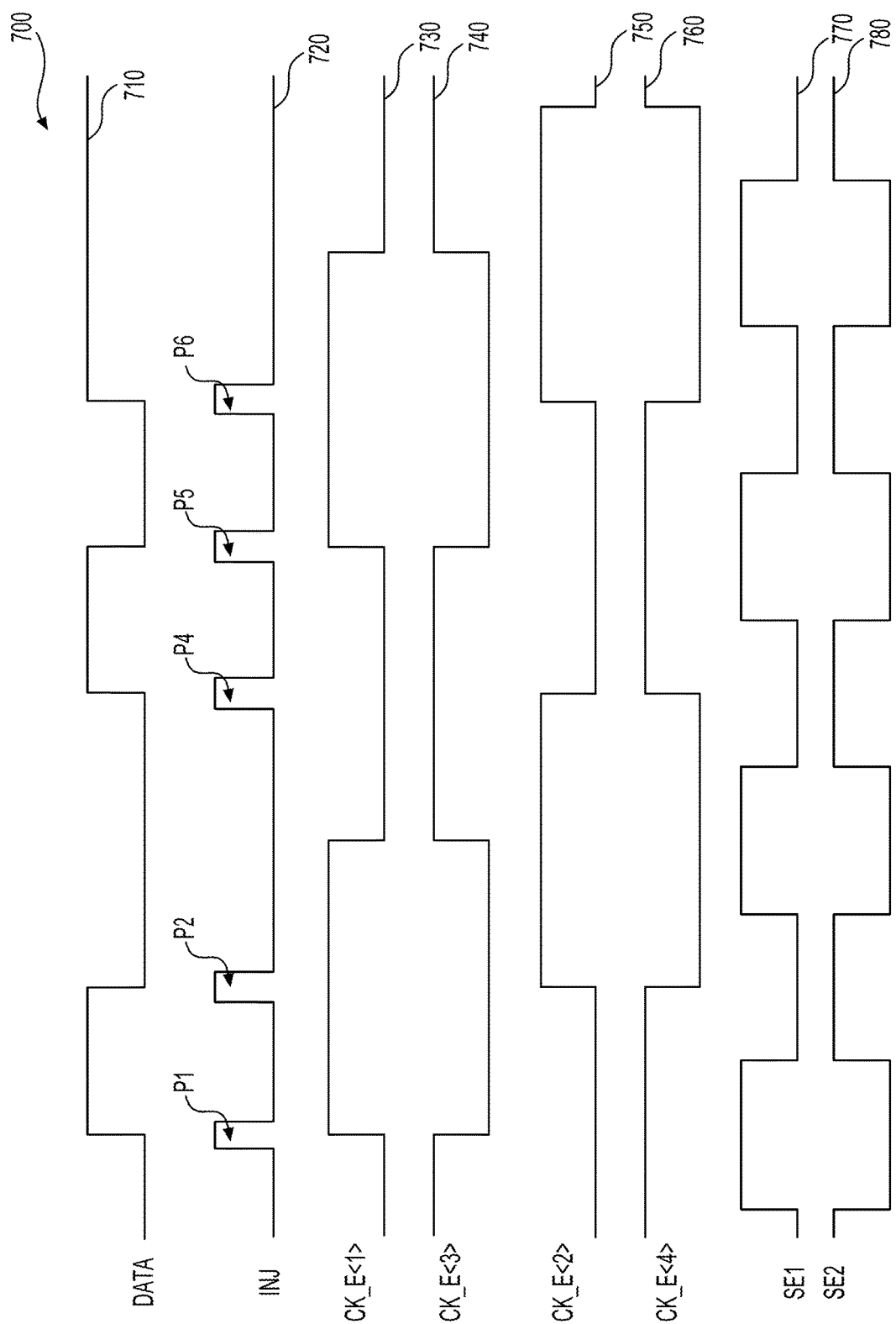
FIG. 7 shows a plot 700 of waveforms for the IL-VCO 630 according to an embodiment of the disclosure.

FIG. 7 shows a plot 700 of waveforms for the IL-VCO 630 according to an embodiment of the disclosure. The plot 700 includes a waveform 710 for the delayed data signal DATA, a waveform 720 for the pulse signal INJ, waveforms 730-760 for the edge clock signals CK_E<1:4>, a waveform 770 for the selection signal SE1, and a waveform 780 for the selection signal SE2.

In the FIG. 7 example, pulses P1, P2, P4, P5 and P6 are generated in response to transitions in the delayed data signal DATA. For example, P1 is generated in response to a transition from data bit 0 to data bit 1, and is positioned at data bit 1. P2 is generated in response to a transition from data bit 1 to data bit 2, and is positioned at data bit 2. P4 is generated in response to a transition from data bit 3 to data bit 4, and is positioned at data bit 4. P5 is generated in response to a transition from data bit 4 to data bit 5, and is positioned at data bit 5. P6 is generated in response to a transition from data bit 5 to data bit 6, and is positioned at data bit 6. In the FIG. 8 example, the pulses P1 and P5 are at odd data bit positions, and the pulses P2, P4 and P6 are at even data bit positions.

Further, in the FIG. 7 example, the selection signals SE1 and SE2 are generated based on center clock signals (not shown). The selection signal SE1 is used to select pulses at the odd data bit positions, such as the pulses P1 and P5, and the selection signal SE2 is used to select pulses at the even data bit positions, such as the pulses P2, P4 and P6.

In an example, logic AND operation is used to combine the enable signals EN<0>-EN<2> and the selection signal SE1 to generate the enable signals EN1<0>-EN1<2>, thus the pulses P1 and P5 are injected in the IL-VCO 730 via the injection circuit 650, and the pulses P2, P4 and P6 are blocked from the injection circuit 650. Further, logic AND operation is used to combine the enable signals EN<0>-EN<2> and the selection signal SE2 to generate the enable signals EN2<0>-EN2<2>, thus the pulses P2, P4 and P6 are injected in the IL-VCO 630 via the injection circuit 670, and the pulses P1 and P5 are blocked from the injection circuit 670.

It is noted that, in some embodiments, the IL-VCO 130 is implemented with odd number of differential delay stages to improve figure of merit (FOM), and the IL-VCO 130 with odd number of differential delay stages is easy to start oscillation. In some examples, due to the better FOM, latch inverters are implemented with much smaller sizes than the driving inverters.

Figure 8:
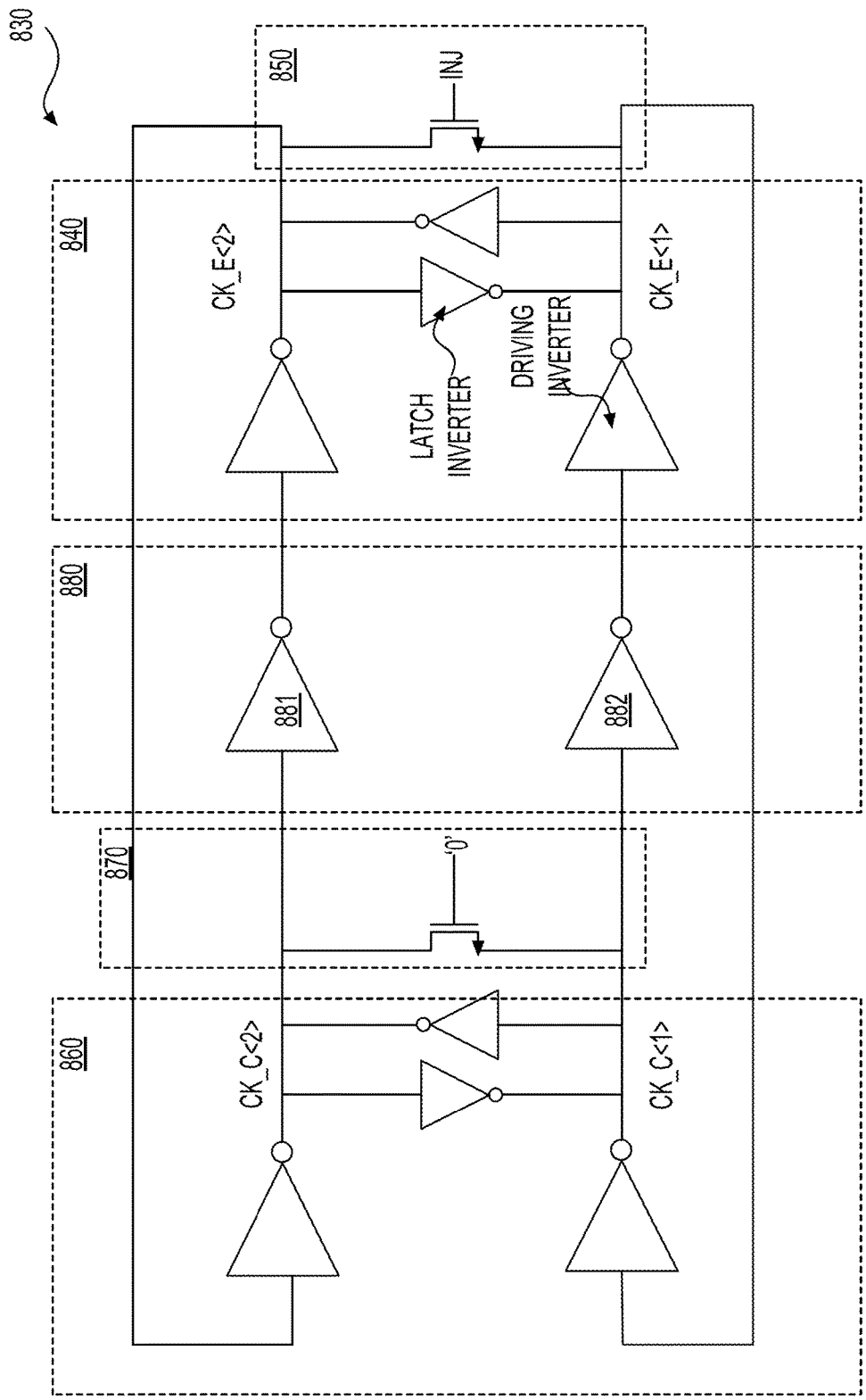
FIG. 8 shows a circuit diagram of an IL-VCO 830 for use in the communication system 100 according to an embodiment of the disclosure.

FIG. 8 shows a circuit diagram of an IL-VCO 830 for use in the communication system 100 according to an embodiment of the disclosure. The IL-VCO 830 is implemented with three differential delay stages, and is configured to generate quadrature-phase clock signals having a frequency that is half data rate.

In the FIG. 8 example, the IL-VCO 830 includes a first differential delay stage 840, a second differential delay stage 860 and a third differential delay stage 880 coupled together to form a ring oscillator. Further, the IL-VCO 830 includes injection circuit 850 that injects pulses into the ring oscillator to force the oscillation signals to phase-align with the injected pulses. The IL-VCO 830 also includes an injection circuit 870 that is a dummy (or replica) injection circuit to match with the injection circuit 850.

The first differential delay stage 840 and the second differential delay stage 860 are similarly configured as the first differential delay stage 240 and the second differential delay stage 260 in the IL-VCO 230 and utilize components that are identical or equivalent to those used in the IL-VCO 230; the description of these components has been provided above and will be omitted here for clarity purposes.

The injection circuit 850 and the injection circuit 870 are similarly configured as the injection circuit 250 and the injection circuit 270 in the IL-VCO 230 and utilize components that are identical or equivalent to those used in the IL-VCO 230; the description of these components has been provided above and will be omitted here for clarity purposes.

The third differential delay stage 880 includes two driving inverters 881 and 882 to receive input signals from the second differential delay stage 860, and to drive output signals to the first differential delay stage 840. The third differential delay stage 880 does not include latch inverters.

In some embodiments, without the latch inverters, the third differential delay stage 880 is implemented with a much smaller delay than the delays of the first differential delay stage 840 and the second differential delay stage 860. Further, in some examples, the first differential delay stage 840 has sharper inputs than the second differential delay stage 860, thus the delay of the first differential delay stage 840 is a little smaller than the second differential delay stage 860. In some examples, the delay sum of the third differential delay stage 880 and the first differential delay stage 840 is about the same as the delay of the second differential delay stage 860.

In the FIG. 8 example, the injection circuit 850 is controlled by the pulse signal INJ to inject pulses at the first differential delay stage 840, thus the first differential delay stage 840 outputs the edge clock signals CK_E<1> and CK_E<2>. Then, second differential delay stage 860 outputs the center clock signals CK_C<1> and CK_C<2> as shown in FIG. 8. The edge clock signals CK_E<1> and CK_E<2>, the center clock signals CK_C<1> and CK_C<2>, and the pulse signal INJ have the similar waveforms as shown in FIG. 3. Thus, the edge clock signals CK_E<1> and CK_E<2>, the center clock signals CK_C<1> and CK_C<2> form the quadrature-phase (e.g., 0°, 90°, 180° and 270°) clock signals.

Figure 9:
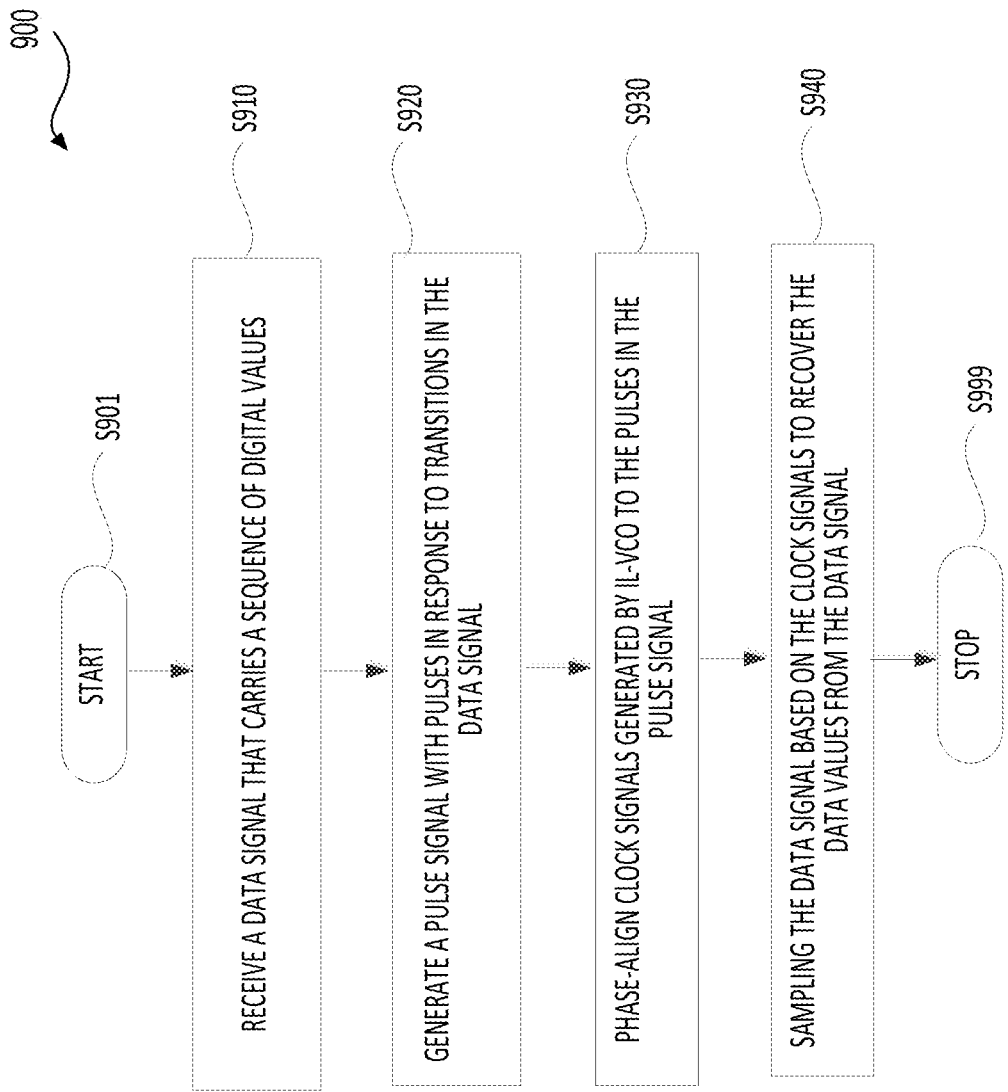
FIG. 9 shows a flow chart outlining a process example 900 that is used in the communication system 100 for clock and data recovery according to an embodiment of the disclosure.

FIG. 9 shows a flow chart of a simplified process example 900 according to an embodiment of the disclosure. In some examples, the process 900 is executed in the communication system 100 for clock and data recovery. The process 900 starts at S901 and proceeds to S910.

At S910, a data signal that carries a sequence of digital values is received. In the FIG. 1 example, the clock and data recovery circuit 120 receives a data input signal $D_{IN}$.

At S920, a pulse signal is generated. Pulses in the pulse signal are generated in response to transitions in the data signal. In the FIG. 1 example, the AFE 121 amplifies the data input signal $D_{IN}$ and generates amplified data signal AFE_OUT. The pulse generation circuit 123 then generates pulses respectively in response to transitions in the amplified data signal AFE_OUT.

At S930, clock signals are generated by an IL-VCO, and are phase-locked to the pulses in the pulse signal. In the FIG. 1 example, the IL-VCO 130 generates the clock signals with a frequency that is controlled based on a control voltage. Further, the pulses are injected into the IL-VCO 130 to phase-lock the clock signals to the pulses. The IL-VCO 130 can be replaced by any of the IL-VCO 230, the IL-VCO 430, the IL-VCO 530, the IL-VCO 630 and the IL-VCO 830.

At S940, the data signal is sampled based on the clock signals to recover the digital values in the data signal. In the FIG. 1 example, the amplified data signal AFE_OUT is suitably delayed by the delay circuit 122 to compensate for the delay of the pulse generation circuit 123 and the IL-VCO 130. The delay circuit 122 outputs the delayed data signal DATA for sampling. The sampling circuit 125 then samples the delayed data signal DATA based on the clock signals to recover the digital values. The sampled data values can be further processed by other suitable circuit. Then the process proceeds to S999 and terminates.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A receiver for receiving data over a wired communication channel, the receiver comprising:
    an analog front end circuit configured to receive an analog signal carrying data over the wired communication channel, and to output a data signal with data bit transitions between voltage levels;
    a pulse generation circuit configured to receive a signal indicative of a noise level of the wired communication channel, generate a pulse signal in response to the data bit transitions in the data signal, and adjust injection gain of the pulse signal based on the noise level; and
    a voltage-controlled oscillator configured to based on the adjusted injection gain of the pulse signal, generate an oscillation signal for providing sampling clock signals for the data signal, and align transitions in the oscillation signal to the pulse signal by forcing the oscillation signal to transit voltage levels in response to a pulse in the pulse signal.

2. The receiver of claim 1, wherein the voltage-controlled oscillator comprises:
    a ring oscillator comprising
        a first differential delay stage configured to generate first differential outputs in response to first differential inputs with a delay that is controlled by a voltage, and
        a second differential delay stage coupled to the first differential delay stage; and
    a first injection circuit configured to force the first differential outputs to transit voltage levels in response to the pulse in the pulse signal.

3. The receiver of claim 2, further comprising:
    a delay circuit configured to delay the data signal to generate a delayed data signal; and
    a sampling circuit configured to sample the delayed data signal based on a clock signal generated by the voltage-controlled oscillator to recover the data received in the analog signal.

4. The receiver of claim 2, wherein the first differential delay stage comprises:
    a first inverter and a second inverter configured to invert the first differential inputs to generate the first differential outputs; and
    a third inverter and a fourth inverter configured to form a latch to maintain the first differential outputs.

5. The receiver of claim 2, wherein the first injection circuit comprises a first switchable path coupled between the first differential outputs and configured to switch on in response to the pulse to force the first differential outputs to transit the voltage levels.

6. The receiver of claim 2, wherein:
    the pulse signal is a first pulse signal;
    the first injection circuit comprises
        a first switchable path configured to switch on/off in response to the first pulse signal to force the first differential outputs to transit the voltage levels, and
        a second switchable path coupled with the first switchable path in parallel and configured to switch on/off in response to a second pulse signal to force the first differential outputs to transit the voltage levels; and
    the pulse generation circuit is configured to selectively generate, based on the signal indicative of the noise level, the first pulse signal and the second pulse signal.

7. The receiver of claim 2, wherein the first injection circuit comprises:
- a first switchable path configured to switch on/off in response to the pulse signal to force the first differential outputs to transit the voltage levels;
- a second switchable path coupled with the first switchable path in parallel and configured to switch on/off in response to the pulse signal to force the first differential outputs to transit the voltage levels; and
- an enable circuit configured to generate, based on the signal indicative of the noise level, a first enable signal to enable/disable the first switchable path and a second enable signal to enable/disable the second switchable path.

8. The receiver of claim 2, wherein;
- the ring oscillator is a four-stage ring oscillator and comprises a third differential delay stage and a fourth differential delay stage;
- the first injection circuit is configured to align outputs of the first differential delay stage to a first subset of pulses at odd data bit positions; and
- a second injection circuit is configured to align outputs of the third differential delay stage to a second subset of the pulses at even data bit positions.

9. The receiver of claim 2, wherein:
- the ring oscillator is a three-stage ring oscillator and comprises a third differential delay stage; and
- one of the second differential delay stage and the third differential delay stage has a smaller delay than the first differential delay stage.

10. The receiver of claim 2, wherein:
- the voltage-controlled oscillator comprises a dummy injection circuit coupled with the second differential delay stage to match with the first injection circuit; and
- the dummy injection circuit is disabled of pulse injection.

11. The receiver of claim 6, wherein
- the first switchable path includes a first transistor that is switched on/off based on the first pulse signal;
- the second switchable path includes a second transistor that is switched on/off based on the second pulse signal; and
- the first transistor and the second transistor have different width to length ratios.

12. A method for receiving data over a wired communication channel, the method comprising:
- receiving an analog signal that carries data over the wired communication channel;
- processing the analog signal to output a data signal with data bit transitions between voltage levels;
- receiving a signal indicative of a noise level of the wired communication channel;
- generating a pulse signal in response to data bit transitions in the data signal;
- adjusting injection gain of the pulse signal based on the noise level;
- aligning transitions in an oscillation signal generated by a voltage-controlled oscillator by forcing the oscillation signal to transit voltage levels in response to a pulse in the pulse signal; and
- based on the adjusted injection gain of the pulse signal, generating clock signals for sampling the data signal based on the oscillation signal.

13. The method of claim 12, wherein;
- aligning the transitions in the oscillation signal generated by the voltage-controlled oscillator comprises switching on/off an injection path coupled between a pair of differential outputs at a differential delay stage in response to the pulse; and
- a switching on of the injection path forces the differential outputs to transit the voltage levels.

14. The method of claim 12, wherein the pulse signal is a first pulse signal, and the method further comprises:
- generating a second pulse signal based on the signal indicative of the noise level;
- switching on/off a first injection path coupled between a pair of differential outputs in response to the first pulse signal; and
- switching on/off a second injection path in parallel with the first injection path in response to the second pulse signal.

15. The method of claim 12, further comprising:
- generating multiple enable signals based on t signal indicative of t noise level; and
- respectively enabling/disabling, according to the enable signals, multiple injection paths that are coupled in parallel between a pair of differential outputs at a differential delay stage.

16. The method of claim 12, wherein the voltage-controlled oscillator includes a four-stage ring oscillator comprising a first differential delay stage, a second differential delay stage, a third differential delay stage and a fourth differential delay stage, and the method further comprises:
- aligning outputs of the first differential delay stage to a first subset of pulses at odd bit positions; and
- aligning outputs of the third differential delay stage to a second subset of the pulses at even bit positions.

17. An integrated circuit comprising receiving circuitry for receiving data over a wired communication channel, the receiving circuitry comprising:
- an analog front end circuit configured to receive an analog signal carrying data over the wired communication channel and output a data signal with data bit transitions between voltage levels;
- a pulse generation circuit configured to receive a signal indicative of a noise level of the wired communication channel, generate a pulse signal in response to the data bit transitions in the data signal, and adjust injection gain of the pulse signal based on the noise level; and
- a voltage-controlled oscillator configured to, based on the adjusted injection gain of the pulse signal, generate an oscillation signal for providing sampling clock signals for the data signal, and align transitions in the oscillation signal to the pulse signal by forcing the oscillation signal to transit voltage levels in response to a pulse in the pulse signal.

18. The integrated circuit of claim 17, wherein the voltage-controlled oscillator comprises:
- a first differential delay stage configured to generate first differential outputs in response to first differential inputs with a delay that is controlled by a voltage;
- a first injection circuit configured to force the first differential outputs to transit voltage levels in response to the pulse in the pulse signal; and
- one or more second differential delay stages configured to couple together and with the first differential delay stage to form a ring oscillator.

19. The integrated circuit of claim 18, wherein the receiving circuitry further comprises:
- a delay circuit configured to delay the data signal to generate a delayed data signal; and a sampling circuit configured to sample the delayed data signal based on a clock signal generated by the voltage-controlled oscillator to recover the data received in the analog signal.

20. The integrated circuit of claim 18, wherein the first injection circuit comprises a first switchable path coupled between the first differential outputs and configured to switch on in response to the pulse to force the first differential outputs to transit the voltage levels.

* * * * *